(12) United States Patent
Zanchi

(10) Patent No.: US 8,319,541 B2
(45) Date of Patent: Nov. 27, 2012

(54) ELECTRICALLY TUNABLE CONTINUOUS-TIME CIRCUIT AND METHOD FOR COMPENSATING A POLYNOMIAL VOLTAGE-DEPENDENT CHARACTERISTIC OF CAPACITANCE

(75) Inventor: Alfio Zanchi, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 13/446,895

(22) Filed: Apr. 13, 2012

(65) Prior Publication Data

US 2012/0200332 A1 Aug. 9, 2012

Related U.S. Application Data

(62) Division of application No. 12/775,406, filed on May 6, 2010, now Pat. No. 8,203,374.

(51) Int. Cl.
*G06G 7/64* (2006.01)

(52) U.S. Cl. .................................. 327/337; 327/382

(58) Field of Classification Search .................. 327/337, 327/382
See application file for complete search history.

(56) References Cited

U.S. PATENT DOCUMENTS

| | | | |
|---|---|---|---|
| 5,144,525 A | 9/1992 | Saxe et al. | |
| 5,581,252 A | 12/1996 | Thomas | |
| 5,736,888 A | 4/1998 | Sharpe-Geisler | |
| 6,084,440 A | 7/2000 | Sousa | |
| 6,124,818 A | 9/2000 | Thomas et al. | |
| 6,281,717 B1 | 8/2001 | Thomas et al. | |
| 6,480,052 B1 | 11/2002 | Pettersen | |
| 6,522,187 B1 | 2/2003 | Sousa | |
| 6,781,434 B2 | 8/2004 | Jensen et al. | |
| 6,853,272 B1 | 2/2005 | Hughes | |
| 6,970,031 B1 | 11/2005 | Martin et al. | |
| 7,064,622 B2* | 6/2006 | Jasa et al. .................. | 331/117 R |
| 7,102,454 B2* | 9/2006 | Sze et al. ................. | 331/117 FE |
| 7,209,016 B2 | 4/2007 | Perry et al. | |
| 7,279,994 B2 | 10/2007 | Takagi | |
| 7,280,001 B2 | 10/2007 | Maligeorgos et al. | |
| 7,382,593 B2 | 6/2008 | Miske et al. | |
| 7,444,252 B2 | 10/2008 | Sihvola | |
| 7,477,113 B1 | 1/2009 | Hughes | |
| 7,519,140 B2* | 4/2009 | Yoshimura ................... | 375/376 |
| 7,587,184 B2 | 9/2009 | Der et al. | |
| 7,646,257 B2* | 1/2010 | Gailus et al. .............. | 331/177 V |
| 7,683,695 B2 | 3/2010 | Sousa et al. | |
| 7,688,155 B2 | 3/2010 | Han et al. | |
| 7,961,057 B2* | 6/2011 | Ong et al. ........................ | 331/51 |
| 7,978,012 B2* | 7/2011 | Wood ............................... | 331/2 |
| 7,990,210 B2* | 8/2011 | Iida et al. ....................... | 330/4.9 |
| 8,010,825 B2* | 8/2011 | Tamura ......................... | 713/503 |
| 8,098,109 B2* | 1/2012 | Li et al. ..................... | 331/177 V |
| 8,143,960 B2* | 3/2012 | Li .............................. | 331/117 FE |
| 8,154,351 B2* | 4/2012 | Tadjpour ......................... | 331/25 |
| 2007/0103845 A1 | 5/2007 | Sousa et al. | |
| 2009/0121912 A1 | 5/2009 | Zanchi et al. | |

* cited by examiner

*Primary Examiner* — Kenneth B. Wells

(74) *Attorney, Agent, or Firm* — William J. Kubida; Peter J. Meza; Hogan Lovells US LLP

(57) ABSTRACT

A capacitance compensation circuit includes an input terminal, a plurality of switches coupled to the input terminal, a plurality of varactors coupled to the plurality of switches, and a plurality of blocking capacitors coupled between the plurality of switches and the plurality of varactors. The capacitance compensation circuit further includes a plurality of adjustable biasing circuits to precisely compensate for linear and parabolic voltage dependent components of an input or other capacitor. Two such circuits can be used with a single input terminal to compensate for both increasing and decreasing voltage dependent characteristics of a target capacitor.

29 Claims, 16 Drawing Sheets

ELECTRICALLY TUNABLE CONTINUOUS-TIME CIRCUIT AND METHOD FOR COMPENSATING A POLYNOMIAL VOLTAGE-DEPENDENT CHARACTERISTIC OF CAPACITANCE

RELATED APPLICATIONS

The present application is a divisional of and claims the benefit of priority to U.S. patent application Ser. No. 12/775,406, filed May 6, 2010, now U.S. Pat. No. 8,203,374 and is related to co-pending application entitled, "Continuous-Time Circuit and Method for Capacitance Equalization Based on Electrically Tunable Voltage Pre-Distortion of a C-V Characteristic", U.S. patent application Ser. No. 12/775,381, filed May 6, 2010, both of which are hereby incorporated by reference in their entirety for all purposes as if fully set forth herein.

BACKGROUND OF THE INVENTION

1. Field of the Invention

The present invention relates, in general, to capacitance compensation circuits, and, more particularly, to a continuous-time circuit and method for compensating a polynomial voltage-dependent characteristic of a capacitor.

2. Relevant Background

Input-dependent capacitance constitutes one of the main limitations to the ideality of a radio-frequency (RF) as well as of an analog precision front-end. In fact, traditionally even necessary structures such as electro-static discharge (ESD) protection diodes and other clamping circuitry have been minimized at the very input of those circuits, to try and mitigate the distortion effects caused by input-dependent capacitance. While the solution of minimizing the input structures may lessen the undesirable effect of input-dependent capacitance, it is not always practical depending on the specific application, nor does it substantially eliminate distortion. For extremely high precision circuits targeting 100 dB of dynamic range and higher, even the small amount of remaining input-dependent capacitance must be addressed. Thus, a need remains for a compensation circuit that can be adjusted to correct for the voltage-dependency in an input capacitor.

SUMMARY OF THE INVENTION

According to a first embodiment of the present invention, a capacitance compensation circuit includes an input terminal, a plurality of switches coupled to the input terminal, a plurality of varactors coupled to the plurality of switches, and a plurality of blocking capacitors coupled between the plurality of switches and the plurality of varactors. The capacitance compensation circuit further includes a plurality of adjustable biasing circuits to precisely compensate for linear and parabolic voltage dependent components of an input or other capacitor.

According to a second embodiment of the present invention, a capacitance compensation circuit includes a first circuit to compensate for input capacitance increasing against the input terminal voltage, including a first plurality of switches coupled to the input terminal, a first plurality of blocking capacitors coupled to the first plurality of switches, and a first plurality of varactors coupled to the plurality of blocking capacitors; and a second circuit to compensate for input capacitance decreasing against the input terminal voltage, including a second plurality of switches coupled to the input terminal, a second plurality of blocking capacitors coupled to the second plurality of switches, and a second plurality of varactors coupled to the second plurality of blocking capacitors. The first and second circuit each include a plurality of adjustable biasing circuits to precisely compensate for linear and parabolic voltage dependent components of an input or other capacitor.

According to a third embodiment of the present invention, a capacitance compensation circuit includes a first plurality of varactors coupled to the input terminal, and a second plurality of varactors coupled to the first plurality of varactors at a plurality of intermediate nodes. The circuit includes a plurality of adjustable biasing circuits to precisely compensate for linear and parabolic voltage dependent components of an input or other capacitor.

According to a fourth embodiment of the present invention, a capacitance compensation circuit includes a first circuit portion including a first plurality of varactors coupled to the input terminal and a second plurality of varactors coupled to the first plurality of varactors at a first plurality of intermediate nodes, and a second circuit portion including a third plurality of varactors coupled to the input terminal and a fourth plurality of varactors coupled to the third plurality of varactors at a second plurality of intermediate nodes. The first and second circuit portions each include a plurality of adjustable biasing circuit to precisely compensate for linear and parabolic voltage dependent components of an input or other capacitor.

BRIEF DESCRIPTION OF THE DRAWINGS

The above and other features of the present invention, its nature and various advantages will become more apparent upon consideration of the following detailed description, taken in conjunction with the accompanying drawings, in which like reference characters refer to like parts throughout, and in which.

DETAILED DESCRIPTION OF THE PREFERRED EMBODIMENTS

Figure 1:
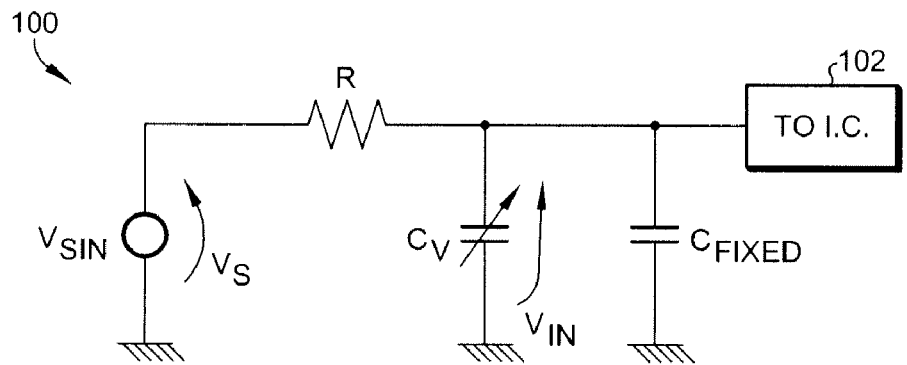
FIG. 1 is a schematic diagram of an input of an integrated circuit associated with, for example, an input pin, showing an input resistance, and an input capacitance having fixed and variable components.

Referring now to FIG. 1, an equivalent circuit 100 of a voltage signal applied to, for example, an input pin of an integrated circuit is shown, where the resistor and capacitors shown can be situated inside or outside the chip, or a combination of the two. In the absence of input resistance, of course the capacitance $C_V$ (input-dependent) would be forced to the correct voltage by the input source ($V_{SIN}$, e.g. sinusoidal). However, either a resistance R or capacitor C which are variable with the voltage imparted across them, can cause the input signal to be distorted before reaching the rest of the I.C. (integrated circuit) 102. Assuming constant resistance R but variable capacitance C, such as:

$$C_V(V_{IN}) = C_O \cdot (1 + \alpha V_{IN} + \beta V_{IN}^2 + \ldots)$$

and noticing that $V_{IN} \approx V_S = A_O \cdot \sin(\omega_O t)$, by using the fundamental capacitor law:

$$i = \frac{dq}{dt} = \frac{d(C \cdot V)}{dt}$$

$$i = \frac{dC}{dt} \cdot V + C \cdot \frac{dV}{dt}$$

and hypothesizing C=C(V):

$$i = \frac{dC(V)}{dV} \cdot \frac{dV}{dt} \cdot V + C(V) \cdot \frac{dV}{dt} = \left[\frac{dC}{dV} \cdot V + C\right] \cdot \frac{dV}{dt}$$

can be written, where the $$\frac{dC(V)}{dV} \cdot V$$

term accounts for the distortion $\Delta i$ in the current i. The resistor will then impart a distortion on the ideal sinusoid $V_S$ in the amount of a factor $R \cdot \Delta i$.

Assuming a quadratic law $C(V)=C_V(V_{IN})$, it is:

$$i = [C_O \cdot (\alpha + 2 \cdot \beta \cdot V) \cdot V + C_O \cdot (1 + \alpha \cdot V + \beta V^2) +] \cdot \frac{dV}{dt} =$$

$$= [C_O + C_O \cdot (\alpha + \alpha) \cdot V + C_O \cdot (2\beta + \beta) \cdot V^2 + \ldots] \cdot \frac{dV}{dt} =$$

$$= C_O \cdot [1 + 2\alpha \cdot V + 3\beta \cdot V^2 + \ldots] \cdot \frac{dV}{dt} =$$

$$= \underbrace{C_O \cdot \frac{dV}{dt}}_{\bar{i}} + \underbrace{C_O \cdot [2\alpha \cdot V + 3\beta \cdot V^2 + \ldots] \cdot \frac{dV}{dt}}_{\Delta i}$$

$$= \bar{i} + \Delta i$$

Since $V_s(t) = A_O \cdot \sin(\omega_0 \cdot t)$, it is immediate to write:

$$\Delta i = C_O \cdot \begin{bmatrix} 2\alpha \cdot A_O \cdot \sin(\omega_0 \cdot t) \cdot A_O \cdot \omega_O \cdot \cos(\omega_O t) + + \\ 3\beta \cdot A_O^2 \cdot \sin^2(\omega_0 t) \cdot A_O \cdot \omega_O \cdot \cos(\omega_O t) + \ldots \end{bmatrix}$$

which, applying the double-angle and Werner trigonometric formulas in cascade, yields:

$$\Delta i = 2 \cdot \alpha \cdot A_O^2 \cdot \omega_O \cdot C_O \cdot \frac{\sin(2 \cdot \omega_O \cdot t)}{2} + +$$

$$3\beta \cdot A_O^3 \cdot \omega_O \cdot C_O \cdot \frac{\cos(\omega_O t) - \cos(3 \cdot \omega_O t)}{4} + \ldots$$

highlighting the existence of second and third harmonic terms (HD2 and HD3) due to the C(V) characteristic. Even in the presence of an otherwise ideal front-end for an RF or A-to-D conversion subsystem, the variability of the input capacitance constitutes therefore a limitation to the SFDR performance of the system.

It is desirable to reduce or eliminate the HD2 and HD3 caused by the C(V) dependence by means of a tunable capacitive compensation circuit that linearizes the total C(V) characteristic of the input node.

Figure 2A:
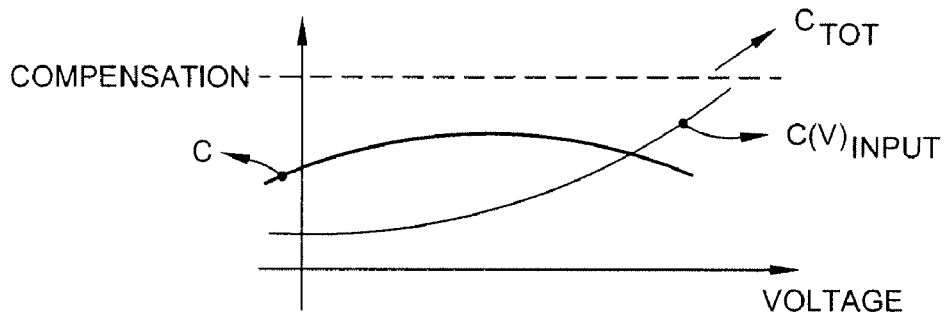
FIG. 2A is a graph showing the voltage dependent characteristic of an input capacitance and the desired characteristic of a compensation capacitor or circuit.
Figure 2B:
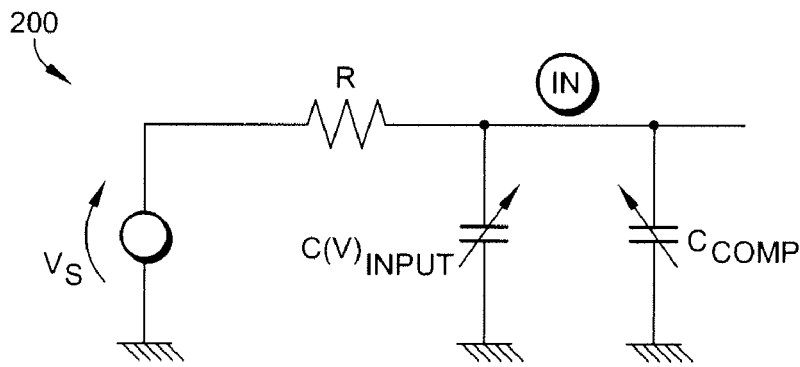
FIG. 2B is a schematic diagram of a capacitance compensation circuit having a voltage-dependent input capacitor and a corresponding compensation capacitor associated with the graph of FIG. 2A.

This is shown in FIGS. 2A and 2B, still object of prior art. FIG. 2B reproduces the input circuit 200 including the voltage input signal, input resistance, and variable input capacitor $C(V)_{INPUT}$. A compensation capacitor $C_{COMP}$ is shown in parallel with $C(V)_{INPUT}$. FIG. 2A shows the capacitance of the voltage-dependent input capacitance with respect to voltage, the desired capacitance of the compensation capacitor with respect to voltage, and the total input capacitance, $C_{TOT}$, with respect to voltage. Note that the total input capacitance is substantially constant with respect to voltage due to the complementary shape of the compensation capacitor curve with respect to the original input capacitance curve.

The desired compensation circuit according to the present invention has to be able to nullify any value of the α and β coefficients of $C_{IN}$ by synthesizing a complementary capacitance characteristic featuring −α and −β coefficients. While the amount of $C_O$ added to the input node is not of primary importance (albeit the smallest $C_O$ is most desirable), since neither the magnitude nor the sign of the coefficients are known a priori, the widest electrical tunability of α and β is to be accomplished for their magnitude, and also to yield an additive (+) or subtractive (−) effect.

The HD2 and HD3 compensation methods and circuits are discussed in turn.

Figure 3A:
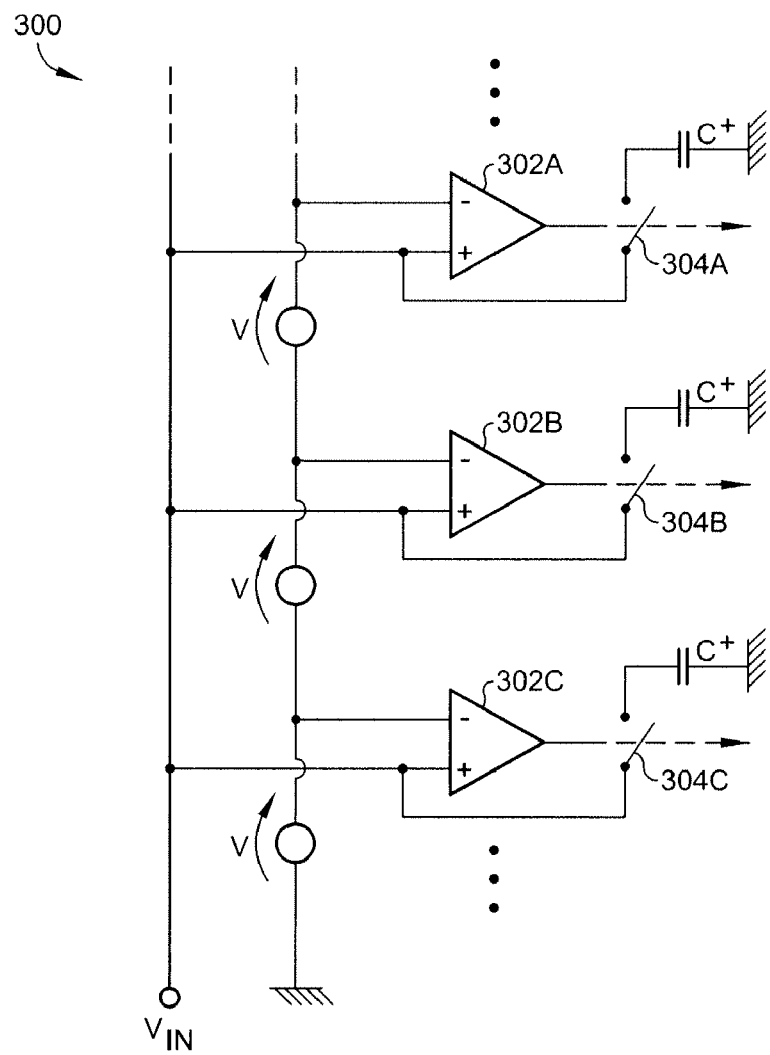
FIG. 3A is a schematic diagram of a portion of a compensation circuit according to the present invention for effecting a linear increase in capacitance with voltage.
Figure 3B:
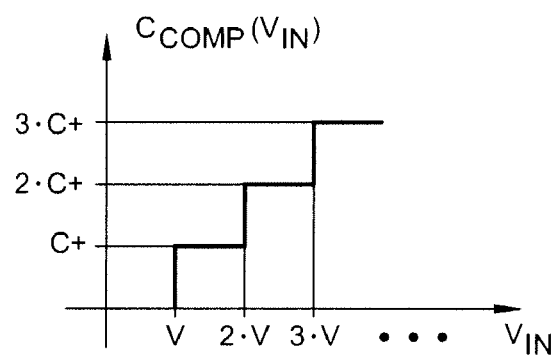
FIG. 3B is a graph showing the piece-wise linear compensation characteristic associated with the compensation circuit portion shown in FIG. 3A.

HD2 is eliminated by adding a linear −α·V term to the $C_{IN}(V)$ capacitor. A linear addition, or accumulation, of capacitance accomplishes this task in one direction, de facto implementing a voltage-to-capacitance converter. The voltage-to-capacitance converter 300 can be construed from prior art and is shown in FIG. 3A, including the input terminal VIN, a series of constant thresholds provided by voltage sources V, a plurality of comparators 302A, 302B, and 302C, a plurality of switches 304A, 304B, and 304C, and a plurality of fixed capacitors C+. The corresponding piece-wise linear capacitance value $C_{COMP}(V_{IN})$ of the additional capacitance versus voltage is shown in FIG. 3B. While three separate stages are shown in FIG. 3A, it is obvious to those skilled in the art that additional such stages can be used to achieve any level of granularity desired in the compensating capacitance characteristic.

Figure 4A:
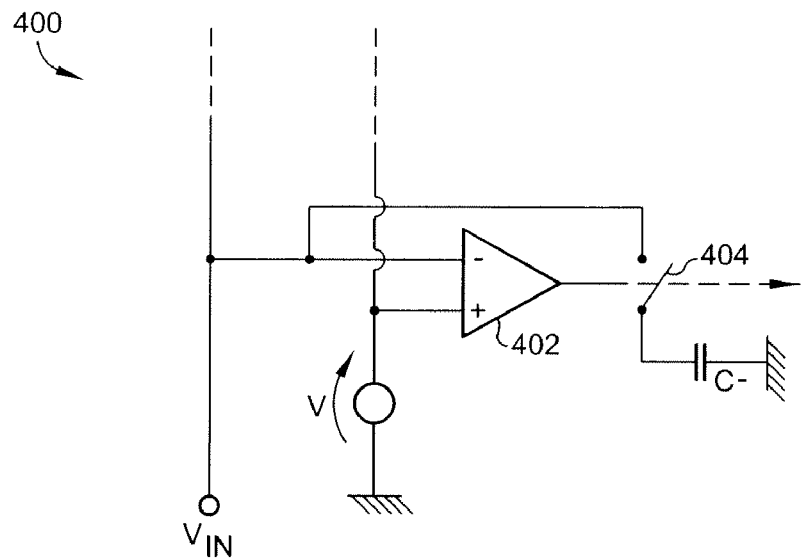
FIG. 4A is a schematic diagram of a portion of a compensation circuit according to the present invention for effecting a linear decrease in capacitance with voltage.
Figure 4B:
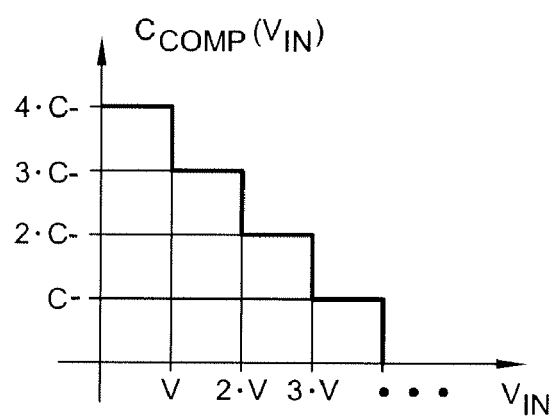
FIG. 4B is a graph showing the piece-wise linear compensation characteristic associated with the compensation circuit portion shown in FIG. 4A.
Figure 5A:
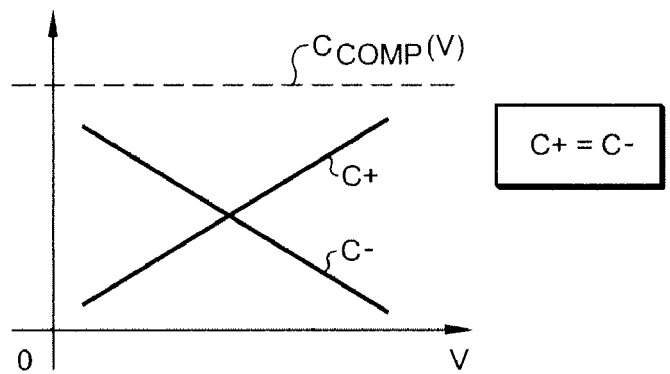
FIG. 5A is a graph showing the compensation method according to the present invention, illustrated in the limit case of both threshold differences and incremental capacitors of FIGS. 3A-4B infinitesimally small for sake of clarity, in which the combined compensation capacitor characteristic is flat with voltage.

Referring now to FIG. 4A, a single converter stage 400 is shown, which can be used in an additional voltage-to-capacitance converter that can also be construed from prior art for providing an opposite sloped compensation capacitor. Only one stage is shown, but of course a plurality of any number of such stages can be used. Reverting the polarity of the comparators 402 leaves all switches 404 "on" for $V_{IN}=0V$, and progressively opens ("off") switches 404 as a consequence of rising $V_{IN}$, which implements a curve shown in FIG. 4B similar to the one shown in FIG. 3B. Note however that the curve in FIG. 4B is substantially complementary to the one shown in FIG. 3B. Increasing the number of converter stages covering the same input voltage span leads to a shrinking voltage covered by each converter stage, which reduces the granularity of the C(V) curve and therefore approximates the staircase progressively into a single line. By combining both circuits on the same $V_{IN}$ node, a combined capacitance is realized, as is shown in FIG. 5A. The positive-sloped C+ compensation capacitor and the negative-sloped C− compensation capacitor are combined to form a total compensation capacitance $C_{TOT}(V)$ that is substantially constant with respect to voltage.

Figure 5B:
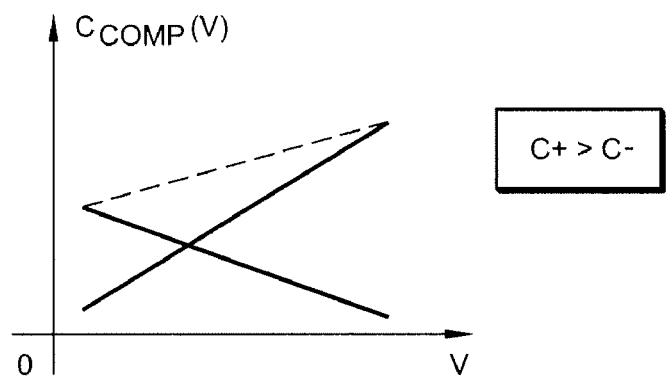
FIG. 5B is a graph showing the compensation method according to the present invention in the same limit case, in which the combined compensation capacitor characteristic is tuned to increase linearly with voltage.
Figure 5C:
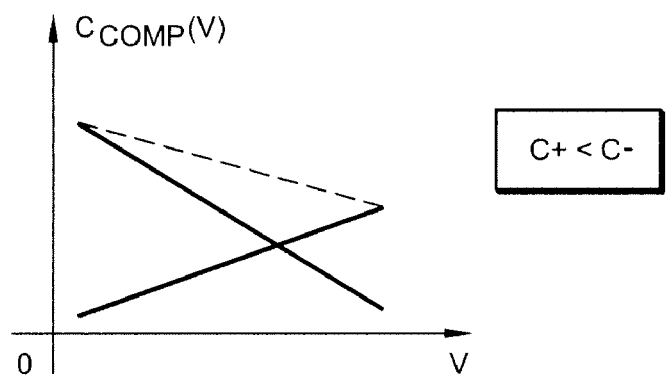
FIG. 5C is a graph showing the compensation method according to the present invention in the same limit case, in which the combined compensation capacitor characteristic is tuned to decrease linearly with voltage.

Of course, if C+>C−, the slope of the rising line is larger than the modulus of the slope of the falling line, and the resulting characteristic is slanted in the rising direction as is shown in FIG. 5B. If C+<C− then the opposite situation occurs, as is shown in FIG. 5C. The present invention proposes an electrically tunable circuit and method to jointly regulate the values of capacitors C+ and C−, hence tuning the "C" component (or, the ordinate axis) of the C(V) curve of the complementary capacitor $C_{COMP}(V_{IN})$. The positive (or negative) slope of the C(V) characteristics is tuned by adjusting C+ versus C−, in order to maximize the flatness of the total capacitance on the input node. A measure of the linearity of the front-end, or of the system as a whole that encompasses the front-end, can be used as a figure of merit to steer the input capacitance balancing process. For lack of direct capacitance measurements, usually extremely challenging when feasible at all, parameters such as the spurious-free dynamic range (SFDR) of an opamp or an A-to-D converter (ADC), the integral non-linearity (INL) of an ADC, or the adjacent channel power ratio (ACPR) in communication apparata, can be elected as feedback parameters of such tuning process.

The circuit proposed by the present invention can substantially cancel out the linear component of $C_{IN}(V)$, thereby reducing or eliminating the term α, i.e. the HD2.

Figure 6:
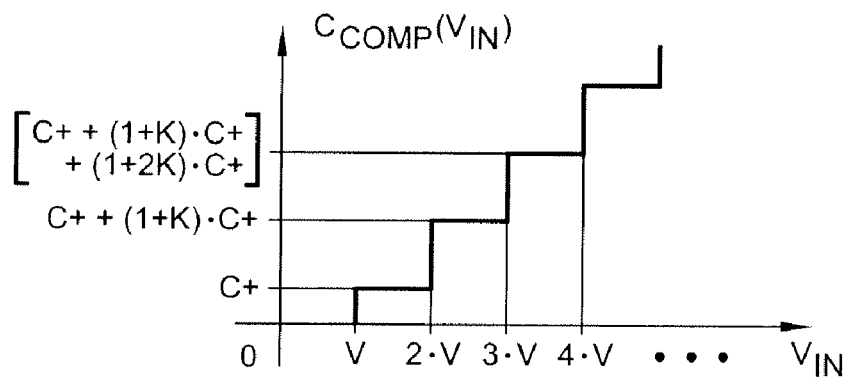
FIG. 6 is a graph showing the piece-wise linear compensation characteristic for effecting an increasing parabolic voltage dependency in an input capacitor according to the present invention.
Figure 7:
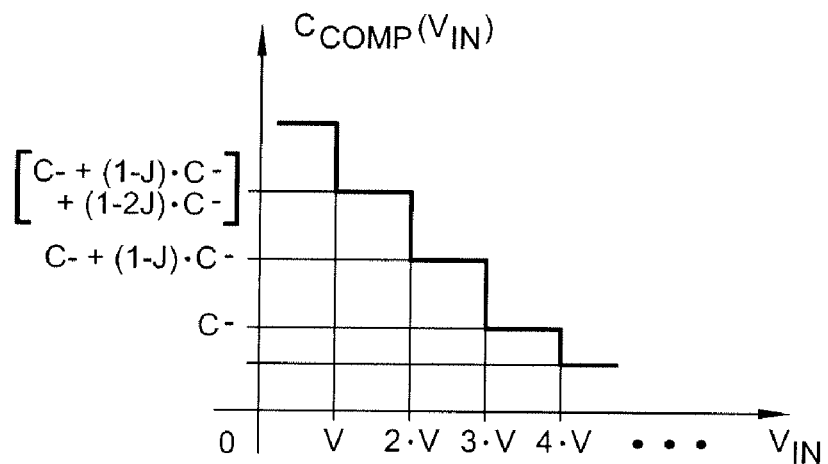
FIG. 7 is a graph showing the piece-wise linear compensation characteristic for effecting a decreasing parabolic voltage dependency in an input capacitor according to the present invention.

As stated by prior art, HD3 can be substantially eliminated by adding a parabolic $-\beta V^2$ term to the $C_{IN}(V)$ capacitor. This quadratic behavior can, for example, result from a linear accumulation of progressively increasing (or decreasing) fixed values of C+. Otherwise stated, since the integral of a ramp is a parabola, if:

$$\int_O^C x \cdot dx = \left[\frac{x^2}{2}\right]_O^C = \frac{C^2}{2}$$

then instancing a series of linearly scaled capacitors C+, (1+k)·C+, (1+2·k)·C+ leads to a parabolic $C_{COMP}(V)$ profile as shown in FIG. 6, which can be combined with a corresponding arrangement of capacitors C− which are progressively decreasing, starting from the lowest up to the highest set of comparators/switches as is shown in FIG. 7.

Figure 8A:
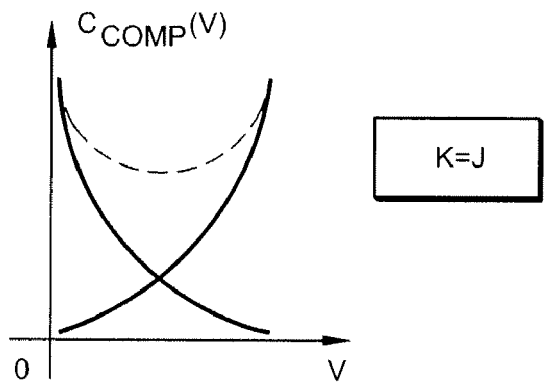
FIGS. 8A-8C are graphs showing the compensation method according to the present invention, illustrated in the limit case of both threshold differences and incremental capacitors of FIGS. 3A-4B infinitesimally small for sake of clarity, in which the combined compensation capacitor characteristic is parabolic and convex.
Figure 8B:
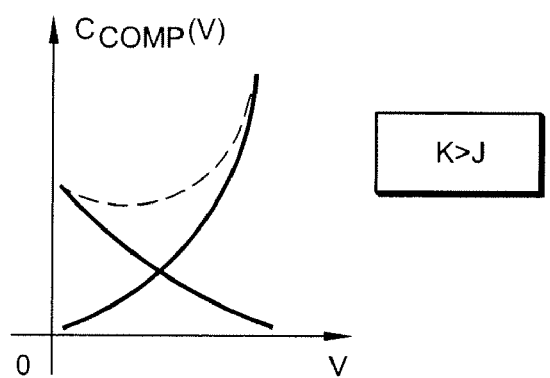
Figure 8C:
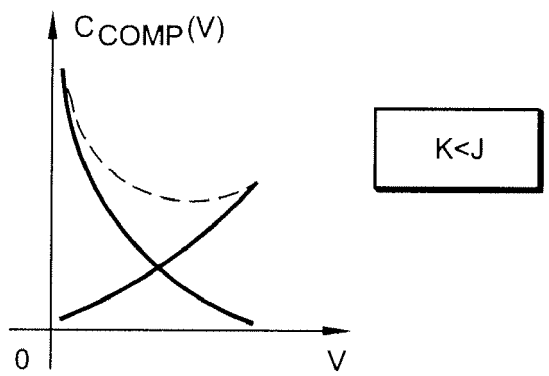

When the number of converter stages is increased, and the granularity is reduced, the two curves combine to yield e.g. a first concave curve shown in FIG. 8A wherein k=j, a second curve shown in FIG. 8B wherein k>j, and a third curve shown in FIG. 8C wherein k<j.

Figure 9:
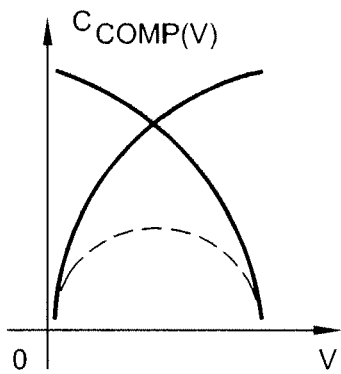
FIG. 9 is a graph showing the compensation method according to the present invention in the same limit case, in which the combined compensation capacitor characteristic is parabolic and concave.

When the sign of k and j is inverted, the parabolas have now opposite curvature, resulting in a convex capacitance profile rather than a concave profile as is shown in FIG. 9.

It will be apparent to those skilled in the art that yet a higher-order polynomial term in the $C_{IN}(V_{IN})$ characteristic can be compensated by imparting a quadratic, or cubic, . . . or n-th order progressive increase or decrease sequence of the varactor capacitance values starting from the lowest up to the highest set of comparators/switches as shown in FIG. 7., rather than a linear one.

The present invention proposes an electrically tunable circuit and method to jointly regulate the rate of increase (or decrease) of capacitors C+ and C− with respect to the sequence of voltage thresholds, by tuning the "C" component of the C(V) curve of the complementary capacitor $C_{COMP}(V_{IN})$. The convex (or concave) parabolic curvature of the C(V) characteristics is modulated by adjusting the rate of increase (or decrease) of C+ versus C−, in order to maximize the flatness of the total capacitance on the input node. The tuning method can again be configured as a feedback process governed by a figure of merit (SFDR, INL peak, ACPR) sensitive to the capacitive-induced distortion. The proposed circuit arrangement according to the present invention can thus also cancel out the parabolic component of $C_{IN}(V)$, reducing or eliminating the term β (i.e. the HD3).

It is important to notice that the sequence of voltage values at which the capacitance is accumulated maintains a constant step; for example, the x-axis of all previous figures is linearly exercised; only the capacitors' values and/or increments are modulated to eliminate α and β. Also, the positive nature of passive capacitors and the accumulation nature of the comparator-stack structure can only lead to a rising ramp when only a single set of converter stages like those shown in FIG. 3A is used. To address both positive- and negative-slanted linear input capacitance, an additional set of converter stages as shown in FIG. 4A must be used. Both sets receive the same input voltage $V_{IN}$ at the corresponding input terminal.

Figure 10:
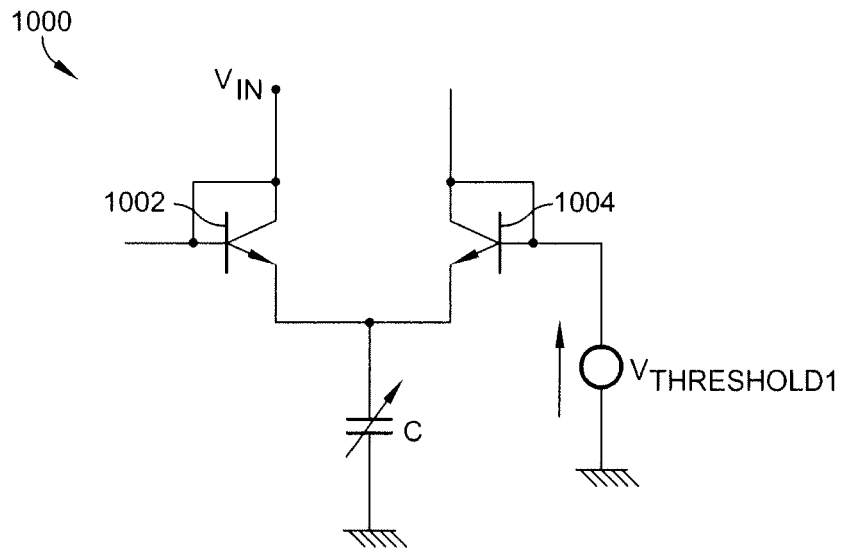
FIG. 10 is a first embodiment of a basic two-value comparator+capacitor circuit suitable for an implementation of the present invention.

Prior art implementations such as shown in FIG. 3A are functional for lower speeds and for compensating high values of input capacitance $C_{IN}$. However, obviously it is desirable to devise a mechanism to vary C+, C−, k, and j for tuning out any possible curvature of $C_{IN}(V)$ as present in the chip. It is therefore convenient to use variable capacitors (also known in the art as varactors, or varicaps) to realize C+ and C−. Also, since the input capacitance of a complete comparator structure can easily overwhelm the $C_{IN}(V)$ capacitance and introduce non-linearities of its own, it is desirable to simplify the comparator+switch structure. For example, in a high-speed bipolar application, a fast switching structure like the one shown in FIG. 10 is proposed. Bipolar switching circuit 1000 includes a first diode-connected transistor 1002 for receiving the $V_{IN}$ input voltage. A second diode-connected transistor 1004 receives a $V_{THRESHOLD1}$ threshold voltage. The emitters of transistors 1002 and 1004 are coupled together and to a tunable capacitor C, which is in turn coupled to ground.

Figure 11:
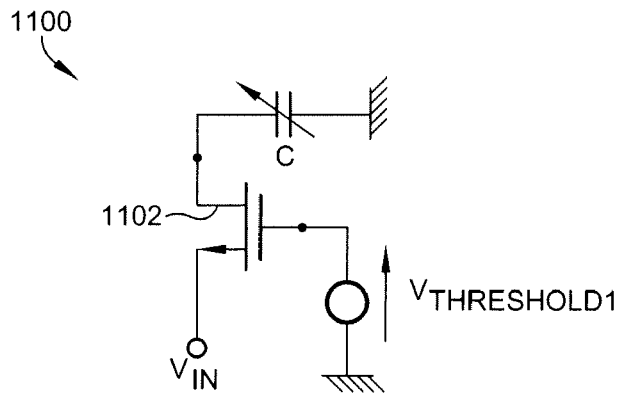
FIG. 11 is a second embodiment of a basic two-value comparator+capacitor circuit suitable for an implementation of the present invention.

With the proper bias, such a switching element based on a diode that engages near $V_{THRESHOLD1}$ can realize the comparator+capacitor topology. A similar concept can be applied to CMOS implementations as shown in circuit 1100 of FIG. 11. In FIG. 11, MOSFET 1102 has a source for receiving the $V_{IN}$ input voltage, a gate for receiving the $V_{THRESHOLD1}$ reference voltage, and a drain coupled to a tunable capacitor C, which is in turn coupled to ground. Circuit 1100 can be used when the $V_{TH}$ of a MOSFET can be tolerated as the difference between $V_{THRESHOLD1}$ and the input voltage $V_{IN}$. The voltage sources of $V_{THRESHOLD1}$ can then be adjusted to compensate for the $V_{TH}$ of the MOSFETs.

In this respect, notice that a solution that ties the varactor C directly to the switch is indeed more complicated than outlined. The usage of varactors to give two constant values C+ and C− independently tunable to correct for α and β is instead implemented as in FIG. 12, where fixed capacitors $C_F$ decouple the $V_{IN}$ from the DC voltage drop across the capacitor. With a fixed voltage on the anode, now the $\Delta V_{HD2}$ on the cathode modulates the capacitance C of the varactors.

Figure 12:
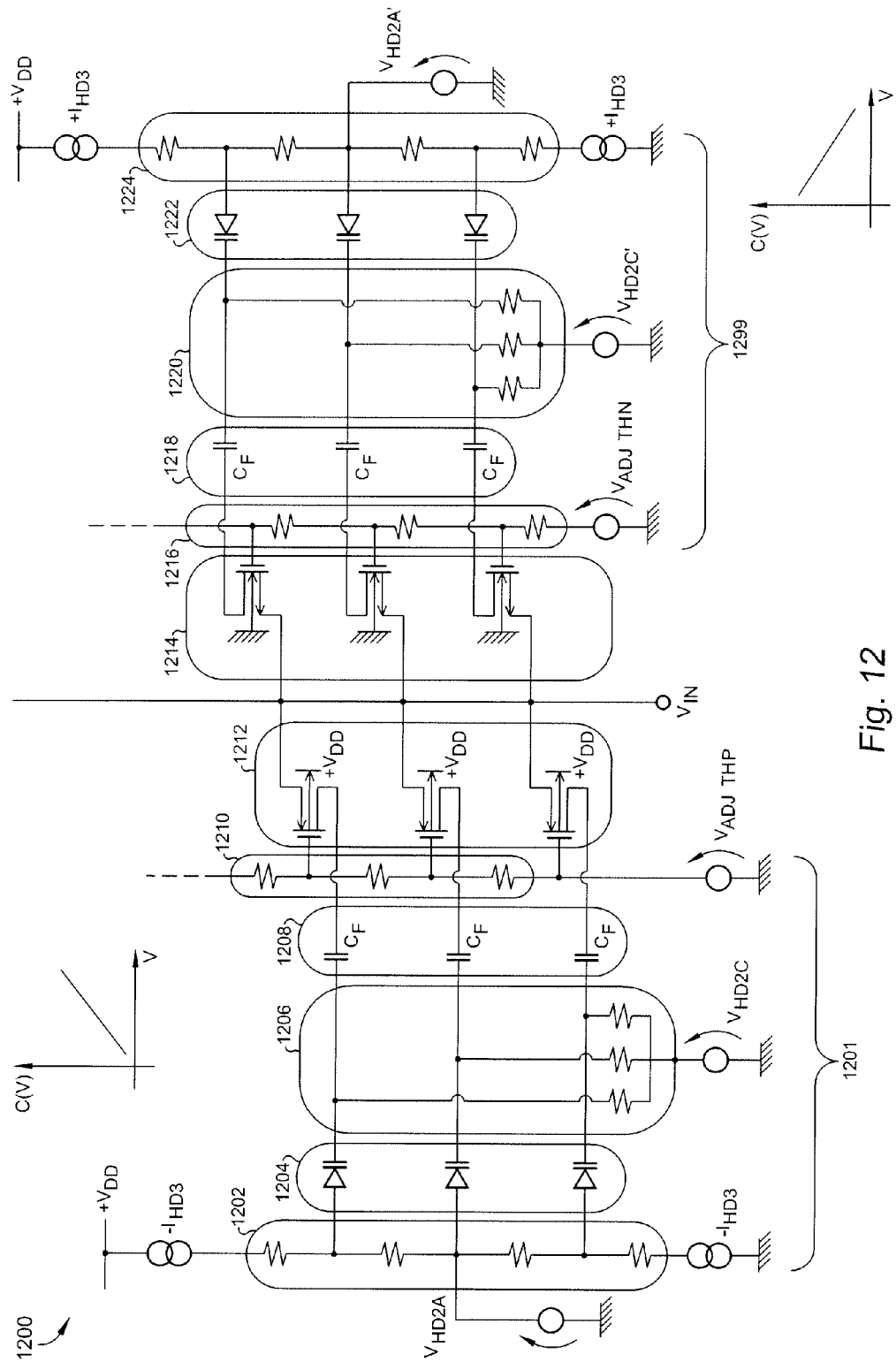
FIG. 12 is a first embodiment of a complete continuous-time capacitor compensation circuit according to the present invention.

Let us refer in detail to circuit 1200 of FIG. 12, the full implementation of a capacitance compensation circuit according to the teachings of the present invention. A first portion of the circuit 1201 includes a resistor string 1202 coupled to a plurality of varactors 1204. Varactors 1204 are coupled to a plurality of biasing resistors 1206 and to a plurality of fixed ("blocking") $C_B$ capacitors 1208. Fixed capacitors 1208 are coupled to the drains of a plurality of PMOS transistors 1212. The gates of the plurality of PMOS transistors 1212 are coupled to a resistor string 1210. All the sources of the plurality of PMOS transistors 1212 are coupled to the input terminal for receiving the $V_{IN}$ input voltage. The body ties of transistors 1212 are coupled to $V_{DD}$. Resistor string 1202 is biased with two $I_{HD3}$ current sources, and an additional $V_{HD2A}$ voltage source at the center tap. Resistors 1206 are biased by a $V_{HD2C}$ voltage source, and resistor string 1210 is biased with the $V_{ADJTHp}$ voltage source. This first portion provides a compensation capacitance whose linear component increases with voltage. The biasing arrangement for the first portion of circuit 1200 is explained in further detail below. It will be apparent to those skilled in the art that there are myriad other techniques for generating biasing voltages and currents, although a conventional approach is shown in FIG. 12.

Continuing to reference FIG. 12, a second portion 1299 of circuit 1200 includes a resistor string 1224 coupled to a plurality of varactors 1222. Varactors 1222 are coupled to a plurality of biasing resistors 1220 and to a plurality of fixed ("blocking") $C_B$ capacitors 1218. Fixed capacitors 1218 are coupled to the drains of a plurality of NMOS transistors 1214. The gates of the plurality of NMOS transistors 1214 are coupled to a resistor string 1216. The sources of the plurality of NMOS transistors 1214 are coupled to the input terminal for receiving the $V_{IN}$ input voltage. The body ties of transistors 1214 are coupled to ground. Resistor string 1224 is biased with two $I_{HD3}$ current sources, and an additional $V_{HD2A'}$ voltage source at the center tap. Resistors 1220 are biased by a $V_{HD2C'}$ voltage source, and resistor string 1216 is biased with the $V_{ADJTHn}$ voltage source. This second portion provides a compensation capacitance whose linear component decreases with voltage. The biasing arrangement for the second portion of circuit 1200 is explained in further detail below. It will be apparent to those skilled in the art that there are myriad other techniques for generating biasing voltages and currents, although a conventional approach is shown in FIG. 12.

In balanced conditions of operation, the current $I_{HD3}=0$ and all varactors of sets 1204 and 1222 are biased with the same voltage $V_{var}=V_{HD2A}-V_{HD2C}=V_{HD2A'}-V_{HD2C'}$ across them, producing linearly increasing and decreasing CM characteristics that add up to a flat overall $C_{COMP}(V_{IN})$ profile. An imbalance in $V_{HD2A}-V_{HD2C}$ versus $V_{HD2A'}-V_{HD2C'}$ will privilege one slope versus the other, synthesizing—as allowed by the linearity of the varactor devices—a linear slant in the overall $C_{COMP}(V_{IN})$. Activating a $I_{HD3}\neq 0$ current will instead engender a linear gradient in the values of the varactors' capacitances, out of phase in the two opposite halves of FIG. 12, and ultimately a concave or convex curvature modification in the overall $C_{COMP}(V_{IN})$.

Since $C_B//C_{varactor}$ yields the effective $C_{IN}$ correction, usually designing for a large $C_B \gg C_{varactor}$ improves the sensitivity. Notice that $C_B$ can be progressively scaled to compensate for the body effect of the switches and consequently compensate for this x-axis distortion, if the MOSFET bulk is not otherwise driven. Analogous measures can be taken by biasing the bulk progressively higher for NMOSFETs that are triggered at higher $V_{IN}$, by way of example, with another string of identical or scaled resistors.

Figure 13:
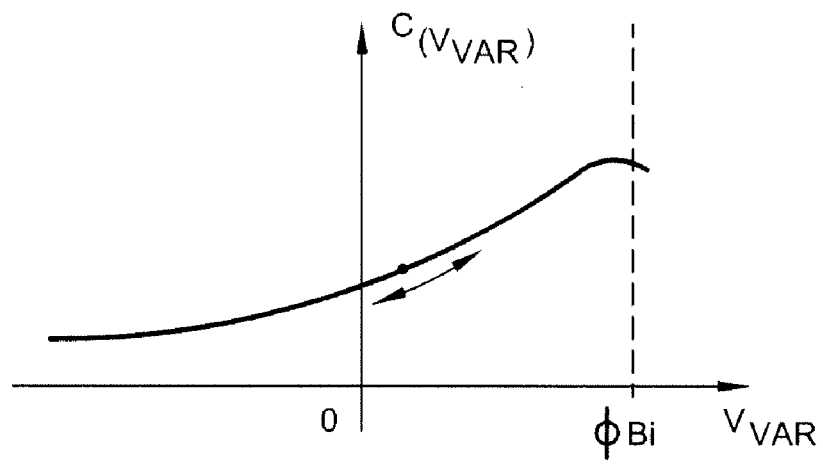
FIGS. 13 and 14 are variable-capacitor device (varactor, or varicap) curves associated with the circuit shown in FIG. 12.

In presence of a C(V) tuning characteristic of a p-n junction varactor of the type:

$$C(V_{var}) = \frac{C_0}{\sqrt[m]{1 - V_{var}/\phi_{bi}}}$$

where m=2÷3 and $\phi_{bi}$ is the built-in voltage of the junction, the $C_{VAR}$ curve is given in FIG. 13.

The capacitor curve shown in FIG. 13 is used to modify HD2 through adjustments of the differential potential $V_{var}=V_{HD2A}-V_{HD2C}$.

Figure 14:
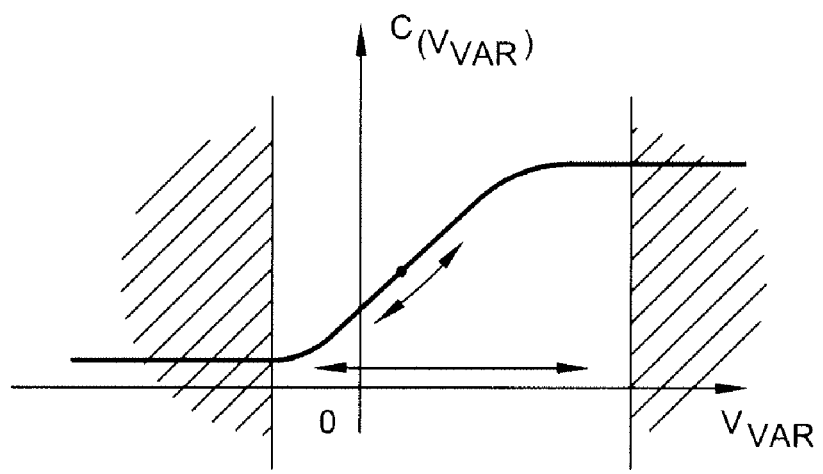

The previous arrangement also allows for implementing the HD3 correction. When a set of cathode voltages $V_{HD2A} \pm nR \cdot I_{HD3}$ is established on the varactors, a set of increasing capacitance values C+ or C− is obtained, and a parabolic $C_{COMP}(V_{IN})$ profile is obtained. Of course, the non-linearity of the $C_{VAR}$ curve induces deviations from the ideal parabolic profile onto $C_{COMP}(V_{IN})$. Rather than an ideal ohmic drop $nR \cdot I_{HD3}$, some non-linear arrangement of resistors can be devised to equalize such $C_{VAR}$ curve. Another solution to this last problem is to use a MOS capacitor, best in accumulation rather than in inversion, and exploit the better linearity of their $C_{VAR}$ curve in the vicinity of the $V_{FLAT\text{-}BAND}$ as is shown in FIG. 14.

The linear region of the $C_{VAR}$ characteristic is only achieved over a narrow band of adjustment voltages (currently 1 to 2V) but allows the HD3 correction by way of a simple resistor string. Also, in this case any forward-biasing of the p-n junctions is avoided in this case. It is also possible to avoid this phenomenon even with traditional varactors, owing to the flexibility of setting $V_{HD2A}$-$V_{HD2C}$ at will. Notice that biasing the MOSFET varactor in either of the "forbidden" flat regions would entail the loss of tunability of the structure, which at that point would correct only for one magnitude of HD2, and have no effect on HD3.

Notice how the direct coupling of the varactor device to the input could forward-bias the diode if a p-n implementation was chosen, but even in the MOS case, the variable capacitance $C_{VAR}$ would in such case be modulated not only by a $V_{HD2A}$-$V_{HD2C}$-$nR \cdot I_{HD3}$ constant voltage, but also by the $V_{IN}$ input voltage. One side of the varactor is going to be connected to $V_{IN}$ only when the corresponding switch turns "on". This makes the circuit $V_{TH}$-dependent and thus more sensitive to process, temperature, and potentially to other phenomena such as radiation-induced discharge. Also, the asymmetry between the side of the circuit using NMOSFETs (to decrease capacitance with rising $V_{IN}$) and PMOSFETs (to increase capacitance with rising $V_{IN}$) causes a skew of approximately $V_{THn}+|V_{THp}|$ which has to be adjusted by shifting the voltage on the opposite electrode of the varactor, a necessity that interferes with the voltage level tuning for the sake of HD2 and HD3 correction. The adoption of blocking capacitors to maintain a well controlled voltage across the varactors greatly relieves these issues and enables a more precise fine-tuning of their values.

Figure 15:
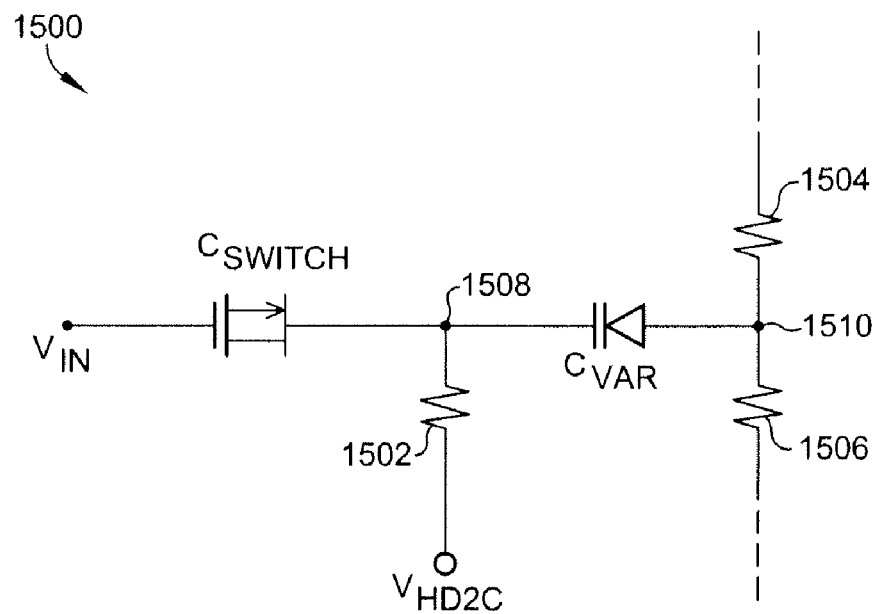
FIG. 15 is an alternative embodiment of a tunable comparator+capacitor circuit suitable for use in a second embodiment of the complete capacitor compensation circuit shown in FIG. 12.

An additional solution making use of a MOSFET varactor in lieu of the MOSFET switch, where the on/off values of the $C_{MOSFET}$ in series with a p-n or MOS varactor are used as a capacitance switching mechanism, can also be envisioned. A realization of a branch of such alternative circuit 1500 is shown in FIG. 15. Circuit 1500 includes a first varactor coupled between the input terminal and an intermediate node 1508, and a second varactor coupled between intermediate node 1508 and center tap node 1510. A resistor 1502 is coupled between intermediate node 1508 and an adjust voltage $V_{HD2C}$. The center tap or biasing voltage 1510 is provided by a resistor string, analogous to 1202 in FIG. 12. Only resistors 1504 and 1506 of the resistor string are depicted.

Figure 16:
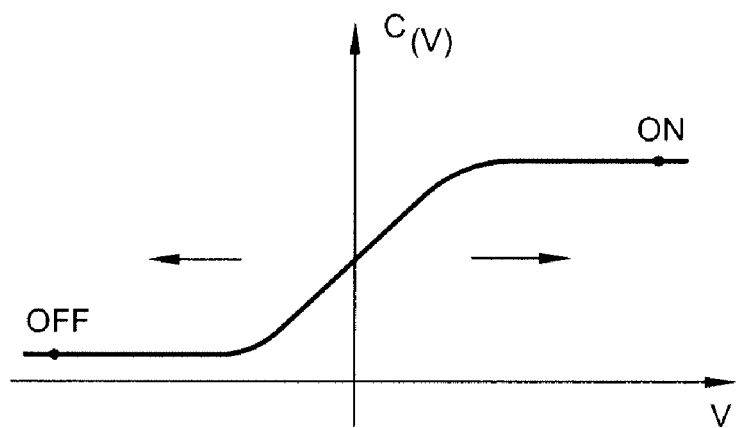
FIG. 16 is a graph of the capacitive characteristic of the alternative embodiment of a tunable comparator+capacitor circuit shown in FIG. 15.

The circuit 1500 shown in FIG. 15 modulates the $C_{VAR}$//$C_{SWITCH}$ by making use of the "saturated" $C_{SWITCH}$ characteristic as is shown in FIG. 16. As can be seen, circuit 1500 can yield very smooth and linear C(V) characteristics. However, this implementation suffers from drawbacks such as:

$C_{SWITCH}$ "on" is not constant, but varies, due to poly-gate depletion mechanisms, and this is enough to modulate the $C_{COMP}(V_{IN})$ as a whole; and since the series $C_{SWITCH}$//$C_{VAR}$ is used, now $C_{SWITCH} \equiv C_P$ can no longer be $>>C_{VAR}$. In fact, the $C_{SWITCH\ ON}$/$C_{SWITCH\ OFF}$ ratio is only 5:1 at the most, and this limits the tunability of the circuit as a whole.

The circuits and embodiments of the present invention present a "piece-wise linear" $C_{COMP}(V_{IN})$ characteristic due to the presence of switches (or comparators). Increasing the number of comparison thresholds improves the granularity of the circuit, reducing the super-harmonics generated by the invention. However, the solution proposed by the present invention does not require buffering, level-shifting, or input re-sampling. It can be therefore directly coupled to the RF or analog precision input in continuous time, thereby compensating the continuous-time $C_{IN}(V_{IN})$ at each instant, with negligible phase delay for frequencies up to the GHz.

FIGS. 17-22 are performance graphs illustrating the various operating modes and improvement in performance over the prior art realized with the circuit and method of the present invention.

Figure 17:
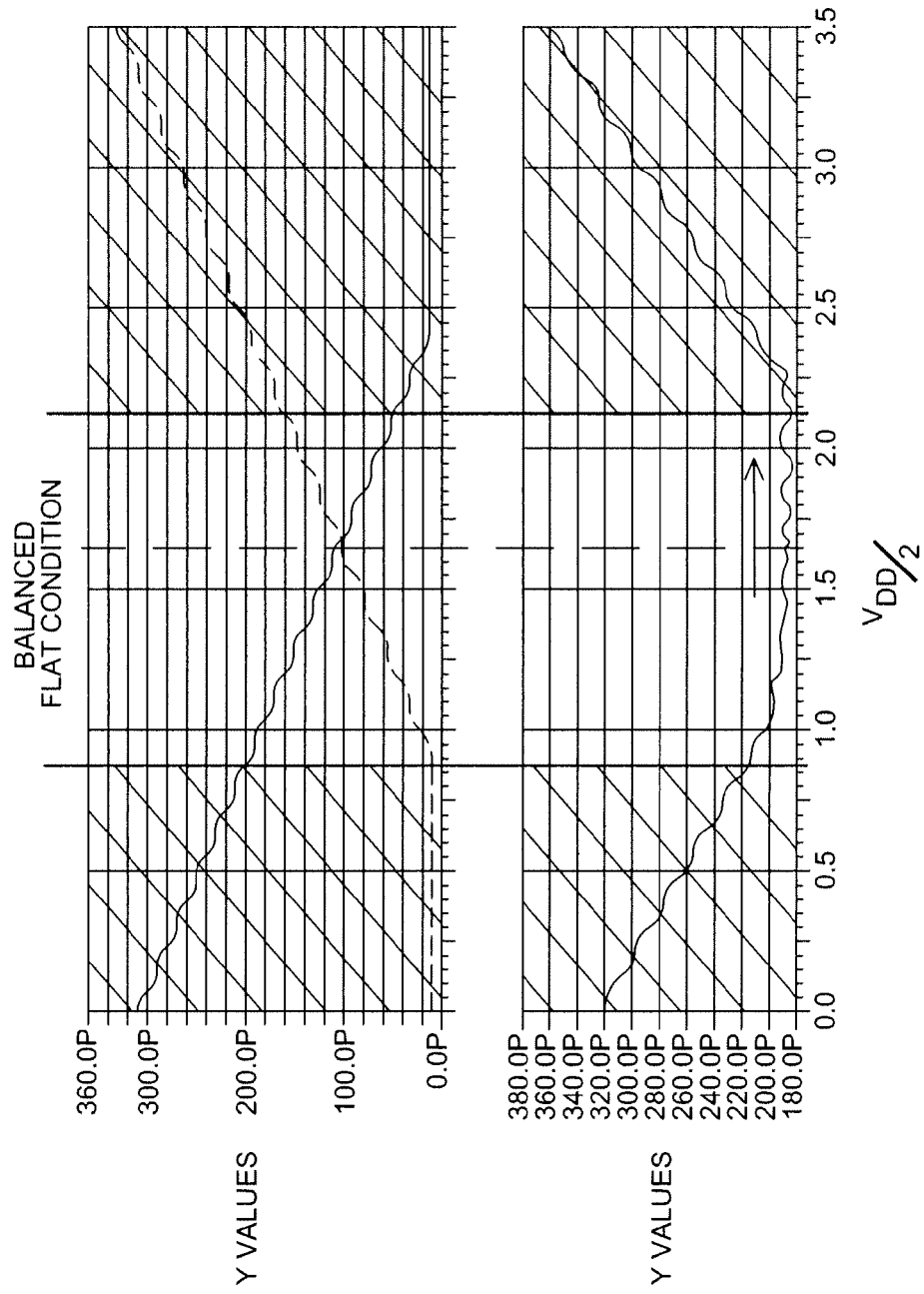
FIGS. 17-22 are performance graphs illustrating the various operating modes and improvement in performance over the prior art realized with the circuit and method of the present invention.

FIG. 17 shows the case when the embodiment of the invention depicted in FIG. 12 is operated in a balanced condition, in which the value of the varactors in sets 1204 and 1222 is made identical by imparting the same potential difference $V_{HD2A}$-$V_{HD2C}$=$V_{HD2A'}$-$V_{HD2C'}$ on both, with $I_{HD3}$=0. Since the positive and negative slopes of the C(V) of both halves of FIG. 12 are identical and no curvature is imparted, the total compensation capacitance seen at the input terminal is flat against $V_{IN}$ at about 190 fF. Higher or lower capacitance values can be synthesized by instancing larger or smaller devices in the physical implementation of the circuit.

Figure 18:
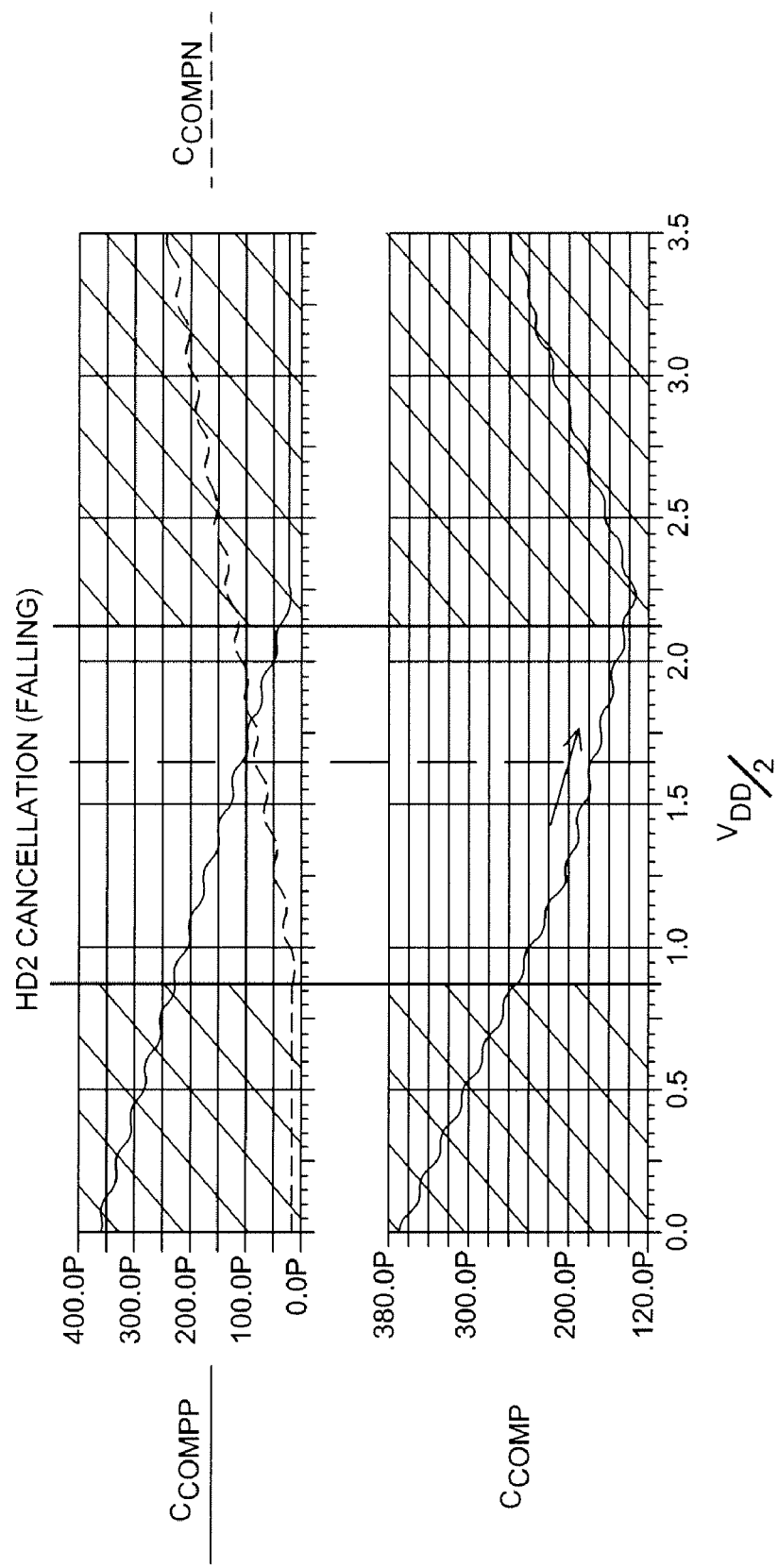

FIG. 18 shows a case when the embodiment of the invention depicted in FIG. 12 is operated to provide HD2 cancellation. The value of the varactors in set 1204 is driven lower than the value of set 1222 by imparting a potential difference $V_{HD2A}$-$V_{HD2C}$<$V_{HD2A'}$-$V_{HD2C'}$, while keeping $I_{HD3}$=0. Since the positive C(V) slope synthesized by set 1204 is exceeded by the negative C(V) slope synthesized by set 1222 and no curvature is imparted, the total compensation capacitance seen at the input terminal is linearly decreasing against $V_{IN}$.

Figure 19:
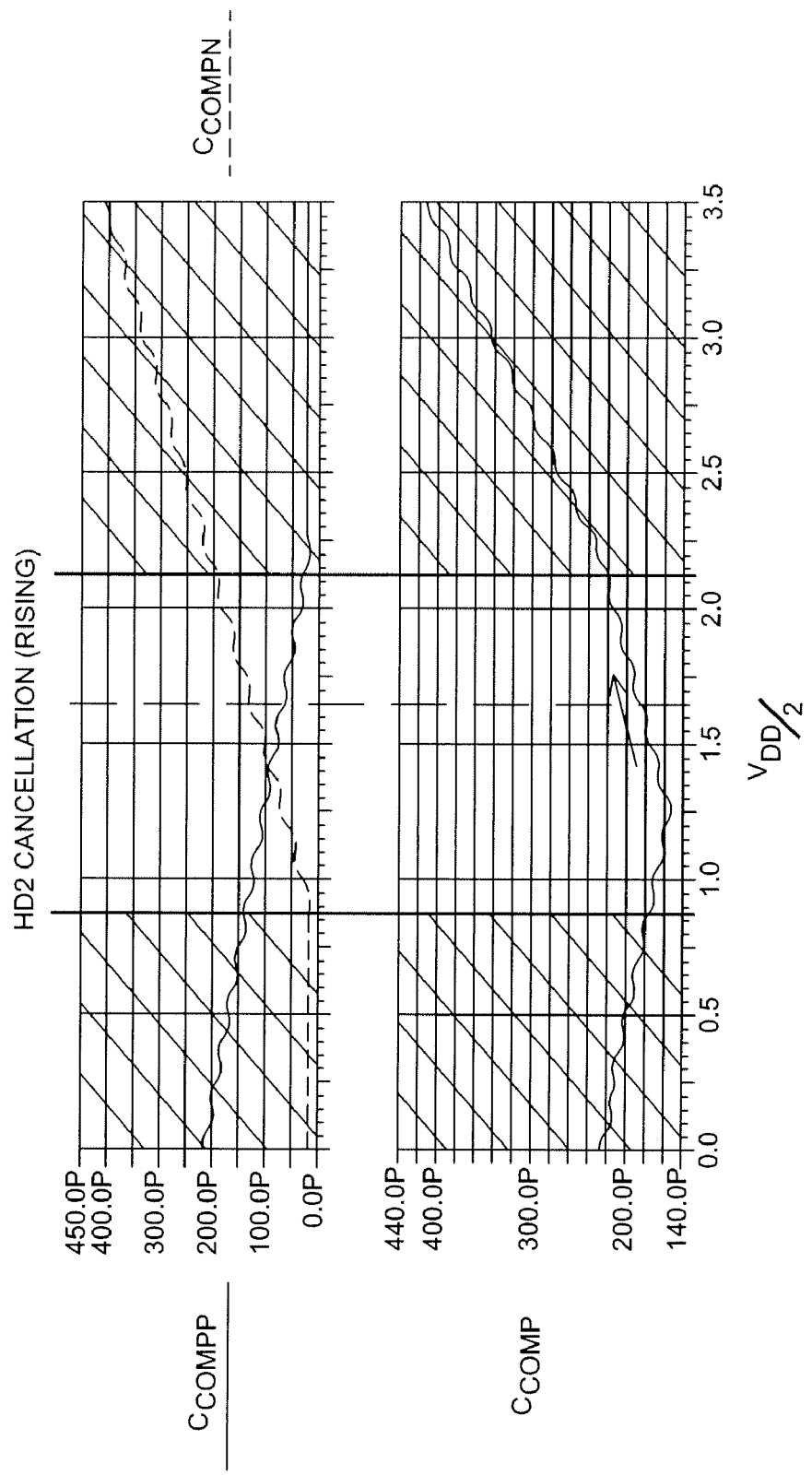

FIG. 19 shows an alternative case when the embodiment of the invention depicted in FIG. 12 is operated to provide HD2 cancellation. The value of the varactors in set 1204 is driven higher than the value of set 1222 by imparting a potential difference $V_{HD2A}$-$V_{HD2C}$>$V_{HD2A'}$-$V_{HD2C'}$, while keeping $I_{HD3}$=0. Since the positive C(V) slope synthesized by set 1204 exceeds the negative C(V) slope synthesized by set 1222 and no curvature is imparted, the total compensation capacitance seen at the input terminal is linearly increasing against $V_{IN}$.

Figure 20:
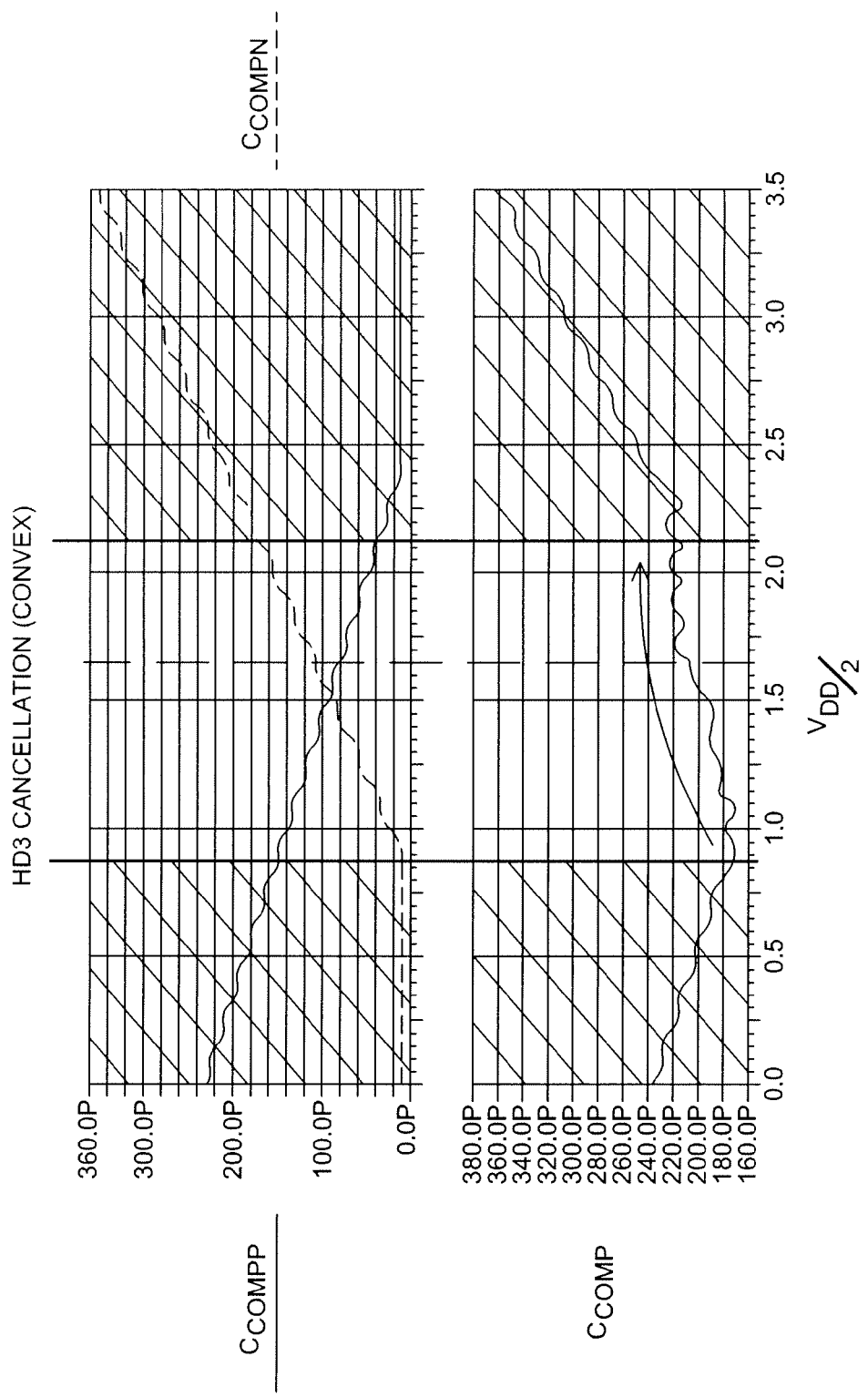

FIG. 20 shows a case when the embodiment of the invention depicted in FIG. 12 is operated to provide HD3 cancellation. The decrement (for increasing $V_{IN}$) in the value of the varactors in set 1204 is opposed to the increment in the value of the varactors in set 1222 by keeping a potential difference $V_{HD2A}$-$V_{HD2C}$=$V_{HD2A'}$-$V_{HD2C'}$, while imparting negative $I_{HD3}$ On the 1202 and positive $I_{HD3}$ on the 1224 branches. Since the convex C(V) curvature synthesized by set 1204 is combined with the convex C(V) curvature synthesized by set 1222, the total compensation capacitance seen at the input terminal is convex against $V_{IN}$. The residual linear slope is a byproduct of the combination of the two parabolae and can be eliminated with the technique previously described, if so desired.

Figure 21:
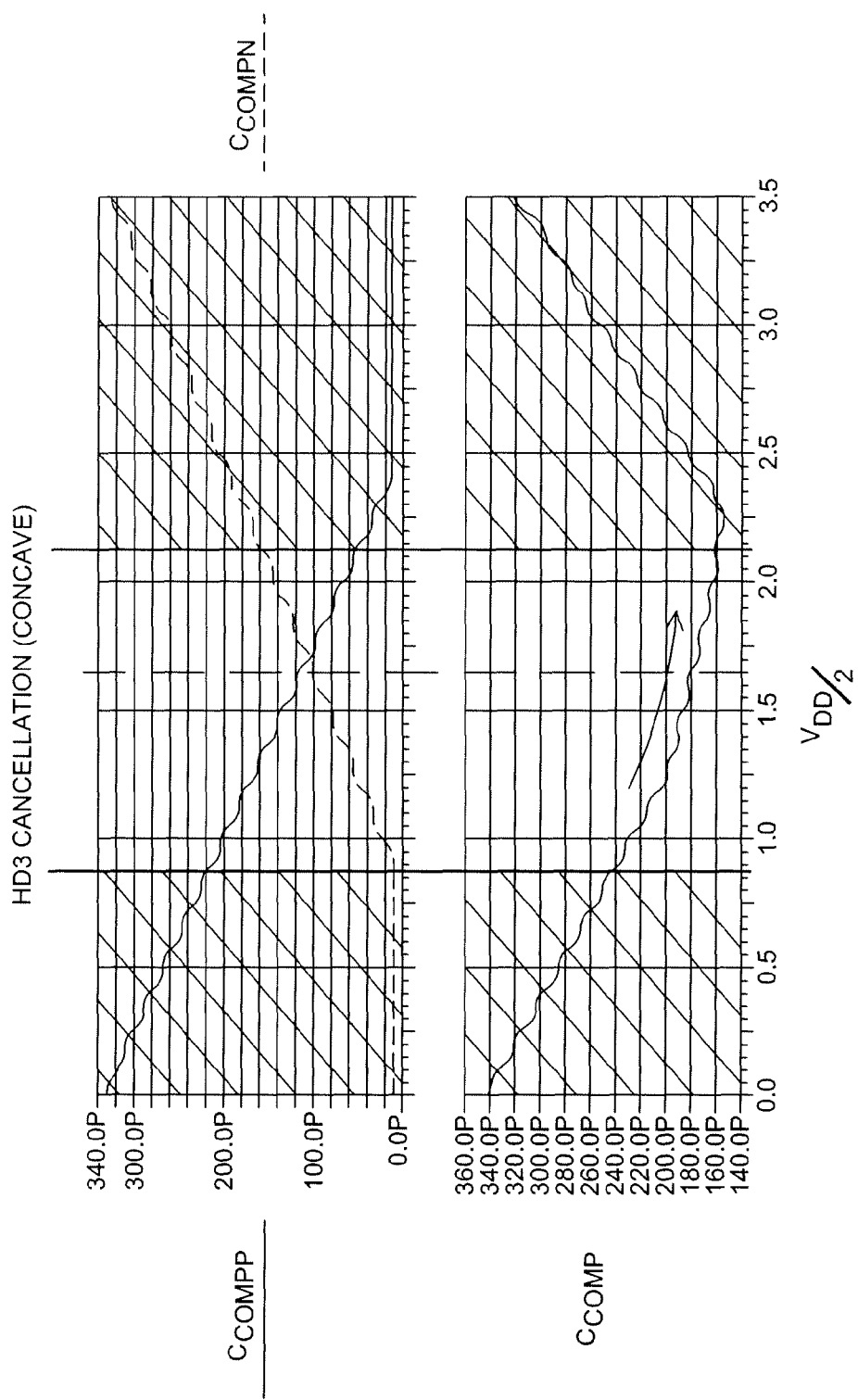

FIG. 21 shows an alternative case when the embodiment of the invention depicted in FIG. 12 is operated to provide HD3 cancellation. The increment (for increasing $V_{IN}$) in the value of the varactors in set 1204 is opposed to the decrement in the value of the varactors in set 1222 by keeping a potential difference $V_{HD2A}$-$V_{HD2C}$=$V_{HD2A'}$-$V_{HD2C'}$, while imparting positive $I_{HD3}$ on the 1202 and negative $I_{HD3}$ on the 1224 branches. Since the concave C(V) curvature synthesized by set 1204 is combined with the concave C(V) curvature synthesized by set 1222, the total compensation capacitance seen at the input terminal is concave against $V_{IN}$. The residual linear slope is a byproduct of the combination of the two parabolae and can be eliminated with the technique previously described, if so desired.

Figure 22:
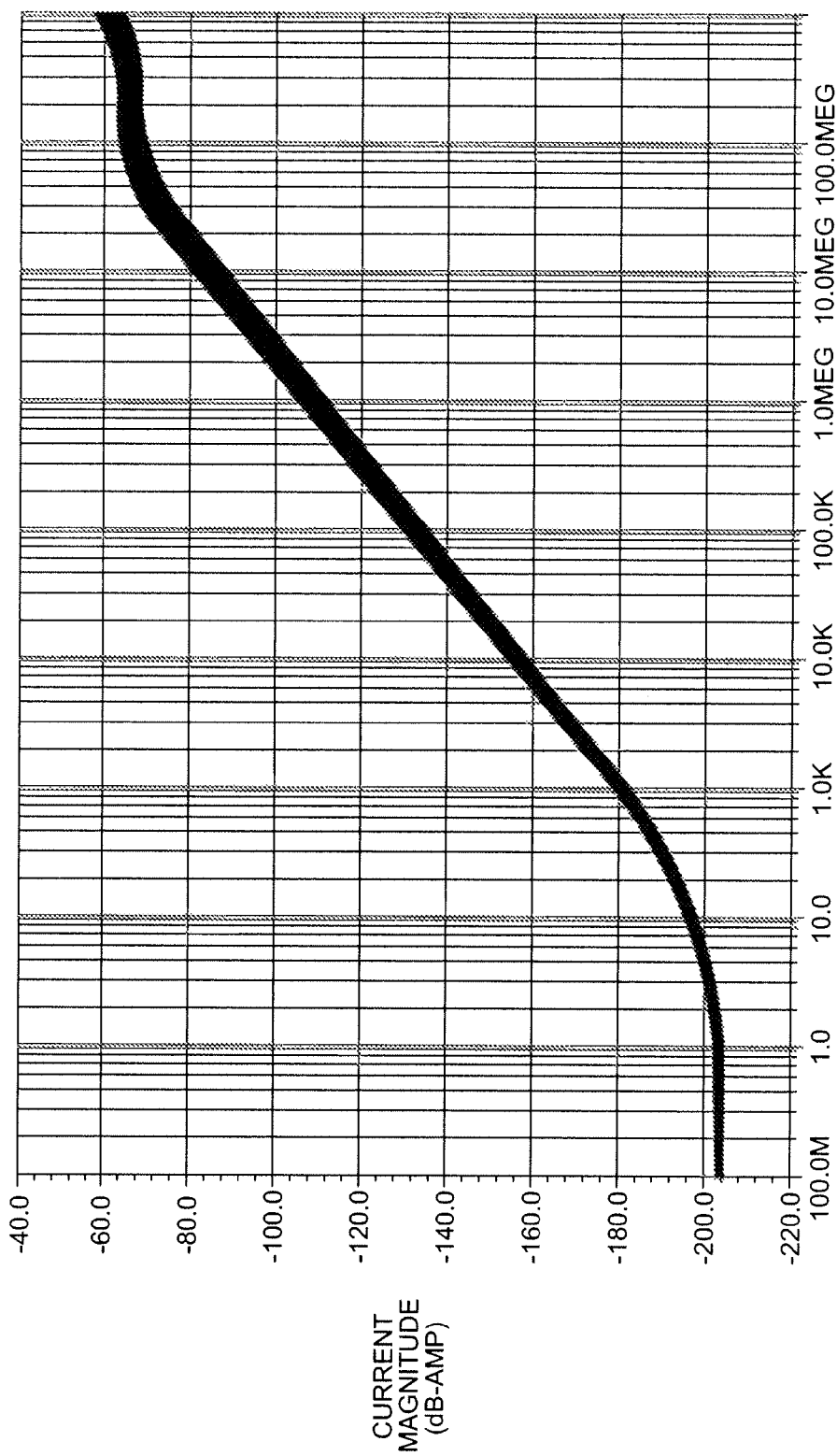

FIG. 22 finally shows the AC capacitive results, in which a frequency sweep of the value of the total capacitance seen at the input of the embodiment of FIG. 12 is reported. The typical $I \propto \omega C_{COMP}$ behavior of the AC current plot highlights the broad range of frequency in which the circuit acts as a capacitor. The variable current level observed against a sweep of $V_{IN}$ reflects the capacitance modulation $C_{COMP}(V_{IN})$, which returns figures such as FIGS. 17-22 when plotted against the $V_{IN}$ value itself.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A capacitance compensation circuit comprising:
   an input terminal;
   a plurality of switches coupled to the input terminal;
   a plurality of varactors coupled to the plurality of switches; and
   an adjustment circuit coupled to the plurality of varactors for separately minimizing second-order harmonic distortion and third-order harmonic distortion affecting a signal at the input terminal.

2. The capacitance compensation circuit of claim 1 further comprising a plurality of blocking capacitors coupled between the plurality of switches and the plurality of varactors.

3. The capacitance compensation circuit of claim 1, wherein the plurality of switches comprises a plurality of devices inactivated by a switching voltage thereof exceeding a threshold voltage.

4. The capacitance compensation circuit of claim 1, wherein the plurality of switches comprises a plurality of devices activated by a switching voltage thereof exceeding a threshold voltage.

5. The capacitance compensation circuit of claim 1 further comprising a plurality of bias levels coupled to a plurality of control terminals associated with the plurality of switches.

6. The capacitance compensation circuit of claim 5, wherein the plurality of bias levels comprises a plurality of constant bias levels.

7. The capacitance compensation circuit of claim 2, wherein the adjustment circuit comprises sing a plurality of bias devices coupled to the plurality of blocking capacitors.

8. The capacitance compensation circuit of claim 7, wherein the adjustment circuit comprises an adjustable bias source coupled to the plurality of bias devices.

9. The capacitance compensation circuit of claim 1, wherein the adjustment circuit comprises a plurality of adjustable bias levels coupled to the plurality of varactors.

10. The capacitance compensation circuit of claim 9, wherein the adjustment circuit comprises an adjustable bias source to similarly adjust the capacitance of each varactor in the plurality of varactors.

11. The capacitance compensation circuit of claim 9, wherein the adjustment circuit comprises an adjustable bias source to linearly adjust the capacitance of consecutive varactors in the plurality of varactors.

12. The capacitance compensation circuit of claim 1, wherein the plurality of varactors comprises a plurality of MOS varactors.

13. The capacitance compensation circuit of claim 1, wherein the plurality of varactors comprises a plurality of p-n junction varactors.

14. The capacitance compensation circuit of claim 1, wherein each varactor in the plurality of varactors is coupled to a corresponding switch in the plurality of switches.

15. A method of compensating a capacitor at an input terminal comprising:
   providing a plurality of switches coupled to the input terminal;
   providing a plurality of blocking capacitors coupled to the plurality of switches;
   providing a plurality of varactors coupled to the plurality of blocking capacitors; and
   an adjustment circuit coupled to the plurality of varactors for separately minimizing second-order harmonic distortion and third-order harmonic distortion affecting a signal at the input terminal.

16. The method of claim 15 further comprising providing a threshold adjustment associated with a plurality of switch control nodes.

17. The method of claim 15, wherein the adjustment circuit provides compensation for a linear variation of the input capacitance against the input terminal voltage via a constant bias adjustment coupled to a plurality of varactor terminals.

18. The method of claim 15, wherein the adjustment circuit provides compensation for a quadratic variation of the input capacitance against the input terminal voltage via a linear bias adjustment coupled to a plurality of varactor terminals.

19. The method of claim 15, wherein each varactor in the plurality of varactors is coupled to a corresponding blocking capacitor in the plurality of blocking capacitors.

20. The method of claim 15, wherein each blocking capacitor in the plurality of blocking capacitors is coupled to a corresponding switch in the plurality of switches.

21. A capacitance compensation circuit comprising:
   an input terminal;
   a first plurality of varactors coupled to the input terminal;
   a second plurality of varactors coupled to the first plurality of varactors at a plurality of intermediate nodes; and
   an adjustment circuit coupled to the second plurality of varactors for separately minimizing second-order harmonic distortion and third-order harmonic distortion affecting a signal at the input terminal.

22. The capacitance compensation circuit of claim 21, wherein the adjustment circuit comprises a bias adjustment circuit coupled to the plurality of intermediate nodes.

23. The capacitance compensation circuit of claim 21, wherein the adjustment circuit comprises a bias adjustment circuit coupled to the second plurality of varactors.

24. The capacitance compensation circuit of claim 21, wherein each varactor in the second plurality of varactors is coupled to a corresponding varactor in the first plurality of varactors at a corresponding intermediate node in the plurality of intermediate nodes.

25. A capacitance compensation circuit comprising:
   an input terminal;
   a first circuit portion including a first plurality of varactors coupled to the input terminal and a second plurality of varactors coupled to the first plurality of varactors at a first plurality of intermediate nodes;
   a second circuit portion including a third plurality of varactors coupled to the input terminal and a fourth plurality of varactors coupled to the third plurality of varactors at a second plurality of intermediate nodes; and
   adjustment circuits respectively coupled to the second and fourth plurality of varactors for separately minimizing second-order harmonic distortion and third-order harmonic distortion affecting a signal at the input terminal.

26. The capacitance compensation circuit of claim 25, wherein the adjustment circuits respectively comprise a first bias adjustment circuit coupled to the first plurality of intermediate nodes, and a second bias adjustment circuit coupled to the second plurality of intermediate nodes.

27. The capacitance compensation circuit of claim 25, wherein the adjustment circuits respectively comprise a first bias adjustment circuit coupled to the second plurality of varactors, and a second bias adjustment circuit coupled to the fourth plurality of varactors.

28. The capacitance compensation circuit of claim 25, wherein each varactor in the second plurality of varactors is coupled to a corresponding varactor in the first plurality of varactors at a corresponding intermediate node in the first plurality of intermediate nodes.

29. The capacitance compensation circuit of claim 25, wherein each varactor in the fourth plurality of varactors is coupled to a corresponding varactor in the third plurality of varactors at a corresponding intermediate node in the second plurality of intermediate nodes.

* * * * *

UNITED STATES PATENT AND TRADEMARK OFFICE
CERTIFICATE OF CORRECTION

PATENT NO. : 8,319,541 B2
APPLICATION NO. : 13/446895
DATED : November 27, 2012
INVENTOR(S) : Alfio Zanchi It is certified that error appears in the above-identified patent and that said Letters Patent is hereby corrected as shown below:

Column 11, line 49, delete "sing"

Signed and Sealed this
Fifth Day of March, 2013

Teresa Stanek Rea
*Acting Director of the United States Patent and Trademark Office*